(12) United States Patent
Peterson et al.

(10) Patent No.: US 12,246,647 B2
(45) Date of Patent: Mar. 11, 2025

(54) VEHICULAR INTERIOR REARVIEW MIRROR ASSEMBLY WITH HEATSINK

(71) Applicant: Magna Mirrors of America, Inc., Holland, MI (US)

(72) Inventors: Austen C. Peterson, Hudsonville, MI (US); Anthony J. LaCross, Hastings, MI (US); Jason A. Durfee, Troy, MI (US); Joel W. Stiverson, Grand Blanc, MI (US)

(73) Assignee: Magna Mirrors of America, Inc., Holland, MI (US)

( * ) Notice: Subject to any disclaimer, the term of this patent is extended or adjusted under 35 U.S.C. 154(b) by 0 days.

(21) Appl. No.: 18/739,528

(22) Filed: Jun. 11, 2024

(65) Prior Publication Data

US 2024/0416835 A1    Dec. 19, 2024

Related U.S. Application Data

(60) Provisional application No. 63/508,516, filed on Jun. 16, 2023.

(51) Int. Cl.
*B60R 1/00* (2022.01)
*B60R 1/04* (2006.01)
*B60R 1/12* (2006.01)
*H05K 7/20* (2006.01)

(52) U.S. Cl.
CPC ............... *B60R 1/04* (2013.01); *B60R 1/12* (2013.01); *H05K 7/2029* (2013.01)

(58) Field of Classification Search
CPC ............ H05K 7/2029; B60R 1/04; B60R 1/12
See application file for complete search history.

(56) References Cited

U.S. PATENT DOCUMENTS

| | | | |
|---|---|---|---|
| 5,216,580 | A | 6/1993 | Davidson et al. |
| 6,062,302 | A | 5/2000 | Davis et al. |
| 6,237,223 | B1 | 5/2001 | McCullough |
| 6,410,982 | B1 | 6/2002 | Brownell et al. |
| 6,490,160 | B2 | 12/2002 | Dibene et al. |

(Continued)

FOREIGN PATENT DOCUMENTS

| | | |
|---|---|---|
| EP | 2930587 A1 | 10/2015 |
| EP | 3279597 A1 | 2/2018 |

(Continued)

*Primary Examiner* — Gerald J Sufleta, II
(74) *Attorney, Agent, or Firm* — HONIGMAN LLP (57) ABSTRACT

A vehicular interior rearview mirror assembly includes a mirror head that accommodates an electronic component and a heatsink assembly. The heatsink assembly includes (i) a first portion that is thermally coupled to the electronic component and draws heat from the electronic component, (ii) a second portion that extends from the first portion, (iii) a chamber extending between the first and second portions and (iv) a phase-changing refrigerant within the chamber. With the refrigerant in a liquid phase and responsive to heating of the first portion, the refrigerant draws heat from the first portion and changes to a gaseous phase. With the refrigerant in the gaseous phase, the refrigerant flows within the chamber and along the second portion and condenses at an inner surface of the second portion to transfer heat to the second portion. The heat is dissipated from the second portion to exterior the mirror head.

23 Claims, 4 Drawing Sheets

(56) References Cited

U.S. PATENT DOCUMENTS

| | | |
|---|---|---|
| 7,369,410 B2 | 5/2008 | Chen et al. |
| 7,422,053 B2 | 9/2008 | Siu |
| 7,650,931 B2 | 1/2010 | Siu |
| 7,914,187 B2 | 3/2011 | Higgins-Luthman et al. |
| 7,965,511 B2 | 6/2011 | Refai-Ahmed |
| 7,974,096 B2 | 7/2011 | Refai-Ahmed |
| 8,737,071 B2 | 5/2014 | Hao et al. |
| 9,405,120 B2 | 8/2016 | Graf et al. |
| 9,436,235 B2 | 9/2016 | Damaraju et al. |
| 9,910,343 B2 * | 3/2018 | Carlson .................. H04N 23/51 |
| 10,017,114 B2 | 7/2018 | Bongwald |
| 10,029,614 B2 | 7/2018 | Larson |
| 10,046,706 B2 | 8/2018 | Larson et al. |
| 10,054,995 B2 | 8/2018 | Jenkins et al. |
| 10,065,574 B2 | 9/2018 | Tiryaki |
| 10,146,275 B2 | 12/2018 | Ghioni et al. |
| 10,166,924 B2 | 1/2019 | Baur |
| 10,327,355 B2 | 6/2019 | Lin |
| 10,356,945 B2 | 7/2019 | Rush et al. |
| 10,421,404 B2 | 9/2019 | Larson et al. |
| 10,442,360 B2 | 10/2019 | LaCross et al. |
| 10,660,236 B2 | 5/2020 | Rush et al. |
| 10,746,479 B2 | 8/2020 | Rush et al. |
| 10,948,241 B2 | 3/2021 | Joshi |
| 10,958,830 B2 | 3/2021 | Koravadi |
| 11,214,199 B2 | 1/2022 | LaCross et al. |
| 11,242,008 B2 | 2/2022 | Blank et al. |
| 11,252,838 B2 | 2/2022 | Lin |
| 11,290,622 B2 * | 3/2022 | Solar ...................... H04N 23/52 |
| 11,428,475 B2 | 8/2022 | Rush et al. |
| 11,518,401 B2 | 12/2022 | Kulkarni |
| 11,582,425 B2 | 2/2023 | Liu |
| 11,639,134 B1 | 5/2023 | Huizen et al. |
| 11,780,372 B2 | 10/2023 | Sobecki et al. |
| 11,827,153 B2 | 11/2023 | Miller et al. |
| 2002/0118511 A1 | 8/2002 | Dujari et al. |
| 2004/0011509 A1 | 1/2004 | Siu |
| 2005/0199376 A1 | 9/2005 | Lee |
| 2006/0196640 A1 | 9/2006 | Siu |
| 2010/0018678 A1 | 1/2010 | Siu |
| 2010/0139893 A1 | 6/2010 | Ding et al. |
| 2010/0175856 A1 | 7/2010 | Meyer, IV et al. |
| 2010/0252418 A1 * | 10/2010 | McCabe ............. C23C 14/3407 |
| | | 204/192.15 |
| 2011/0083835 A1 | 4/2011 | Chen et al. |
| 2013/0107563 A1 * | 5/2013 | McCabe .................. G02B 5/10 |
| | | 362/540 |
| 2014/0285666 A1 | 9/2014 | O'Connell et al. |
| 2014/0336876 A1 | 11/2014 | Gieseke et al. |
| 2015/0009010 A1 | 1/2015 | Biemer |
| 2015/0015710 A1 | 1/2015 | Tiryaki |
| 2015/0022664 A1 | 1/2015 | Pflug et al. |
| 2015/0092042 A1 | 4/2015 | Fursich |
| 2015/0232030 A1 | 8/2015 | Bongwald |
| 2015/0294169 A1 | 10/2015 | Zhou et al. |
| 2015/0296135 A1 | 10/2015 | Wacquant et al. |
| 2015/0352953 A1 | 12/2015 | Koravadi |
| 2016/0137126 A1 | 5/2016 | Fursich et al. |
| 2016/0209647 A1 | 7/2016 | Fursich |
| 2016/0356162 A1 | 12/2016 | Jones et al. |
| 2017/0064868 A1 | 3/2017 | Rush et al. |
| 2017/0217367 A1 | 8/2017 | Pflug et al. |
| 2017/0274906 A1 | 9/2017 | Hassan et al. |
| 2017/0304964 A1 | 10/2017 | Andersen et al. |
| 2017/0355312 A1 | 12/2017 | Habibi et al. |
| 2018/0120912 A1 | 5/2018 | Jenkins et al. |
| 2018/0134217 A1 | 5/2018 | Peterson et al. |
| 2018/0154442 A1 | 6/2018 | Milshtein et al. |
| 2018/0222414 A1 | 8/2018 | Ihlenburg et al. |
| 2018/0231976 A1 | 8/2018 | Singh |
| 2018/0320985 A1 | 11/2018 | Salim Shirazy et al. |
| 2019/0082560 A1 | 3/2019 | Dede et al. |
| 2019/0118717 A1 | 4/2019 | Blank et al. |
| 2019/0146297 A1 | 5/2019 | Lynam et al. |
| 2019/0210615 A1 | 7/2019 | Caron et al. |
| 2019/0258131 A9 | 8/2019 | Lynam et al. |
| 2019/0387643 A1 | 12/2019 | Jeffers |
| 2020/0143560 A1 | 5/2020 | Lu et al. |
| 2020/0202151 A1 | 6/2020 | Wacquant |
| 2020/0320320 A1 | 10/2020 | Lynam |
| 2021/0155167 A1 | 5/2021 | Lynam et al. |
| 2021/0162926 A1 | 6/2021 | Lu |
| 2021/0245662 A1 * | 8/2021 | Blank ...................... B60R 1/081 |
| 2021/0291739 A1 | 9/2021 | Kasarla et al. |
| 2021/0306538 A1 * | 9/2021 | Solar ...................... H04N 23/51 |
| 2021/0307202 A1 | 9/2021 | Abate et al. |
| 2021/0323473 A1 | 10/2021 | Peterson et al. |
| 2021/0382375 A1 * | 12/2021 | Sesti ...................... H04N 23/57 |
| 2022/0169178 A1 * | 6/2022 | Herrmann .............. B60Q 9/008 |
| 2022/0242438 A1 | 8/2022 | Sobecki et al. |
| 2022/0254132 A1 | 8/2022 | Rother |
| 2022/0377219 A1 | 11/2022 | Conger et al. |
| 2024/0064274 A1 | 2/2024 | Blank et al. |
| 2024/0168355 A1 | 5/2024 | Baur |
| 2024/0190456 A1 | 6/2024 | P et al. |
| 2024/0217437 A1 | 7/2024 | LaCross |

FOREIGN PATENT DOCUMENTS

| | | |
|---|---|---|
| EP | 3346220 A1 | 7/2018 |
| JP | 2018035947 A | 3/2018 |
| TW | 201335539 A | 9/2013 |
| WO | 2023220222 A1 | 11/2023 |

* cited by examiner

VEHICULAR INTERIOR REARVIEW MIRROR ASSEMBLY WITH HEATSINK

CROSS REFERENCE TO RELATED APPLICATION

The present application claims the filing benefits of U.S. provisional application Ser. No. 63/508,516, filed Jun. 16, 2023, which is hereby incorporated herein by reference in its entirety.

FIELD OF THE INVENTION

The present invention relates generally to the field of interior rearview mirror assemblies for vehicles.

BACKGROUND OF THE INVENTION

It is known to provide a mirror assembly that is adjustably mounted to an interior portion of a vehicle, such as via a single or double ball pivot or joint mounting configuration where the mirror casing and reflective element are adjusted relative to the interior portion of a vehicle by pivotal movement about the single or double ball pivot configuration. The mirror casing and reflective element are pivotable about one or two ball pivot joints by a user that is adjusting a rearward field of view of the reflective element.

SUMMARY OF THE INVENTION

An interior rearview mirror assembly includes a mirror head adjustable relative to a mounting base. The mounting base is configured to attach at an interior portion of a vehicle equipped with the interior rearview mirror assembly. The mirror head includes a mirror casing and a mirror reflective element and the mirror head accommodates an electronic component that, when electrically operated, generates heat within an interior cavity of the mirror head. The mirror head accommodates a heatsink assembly, and the heatsink assembly is thermally coupled to the heat generating electronic component. The heatsink assembly, when the electronic component generates heat within the mirror head, draws heat away from the electronic component. The heatsink assembly includes (i) a first portion that is thermally coupled to the heat generating electronic component, (ii) a second portion that extends away from the first portion and away from the heat generating electronic component within the interior cavity of the mirror head, (iii) an interior chamber defined by respective inner surfaces of the first portion and the second portion of the heatsink assembly and (iv) a phase-changing refrigerant accommodated within the interior chamber. With the phase-changing refrigerant in a liquid phase and responsive to heating of the first portion of the heatsink assembly, the phase-changing refrigerant draws heat from the first portion of the heatsink assembly and vaporizes from the liquid phase to a gaseous phase. With the phase-changing refrigerant in the gaseous phase, the phase-changing refrigerant moves or flows within the interior chamber and along the second portion of the heatsink assembly and condenses against or at the inner surface of the second portion of the heatsink assembly to convey heat to the second portion of the heatsink assembly. Heat is dissipated from the second portion of the heatsink assembly and exterior the mirror head, such as via slots or vents formed in the mirror casing or via thermal coupling of the heatsink assembly and the mirror casing.

These and other objects, advantages, purposes and features of the present invention will become apparent upon review of the following specification in conjunction with the drawings.

DESCRIPTION OF THE PREFERRED EMBODIMENTS

Figure 1:
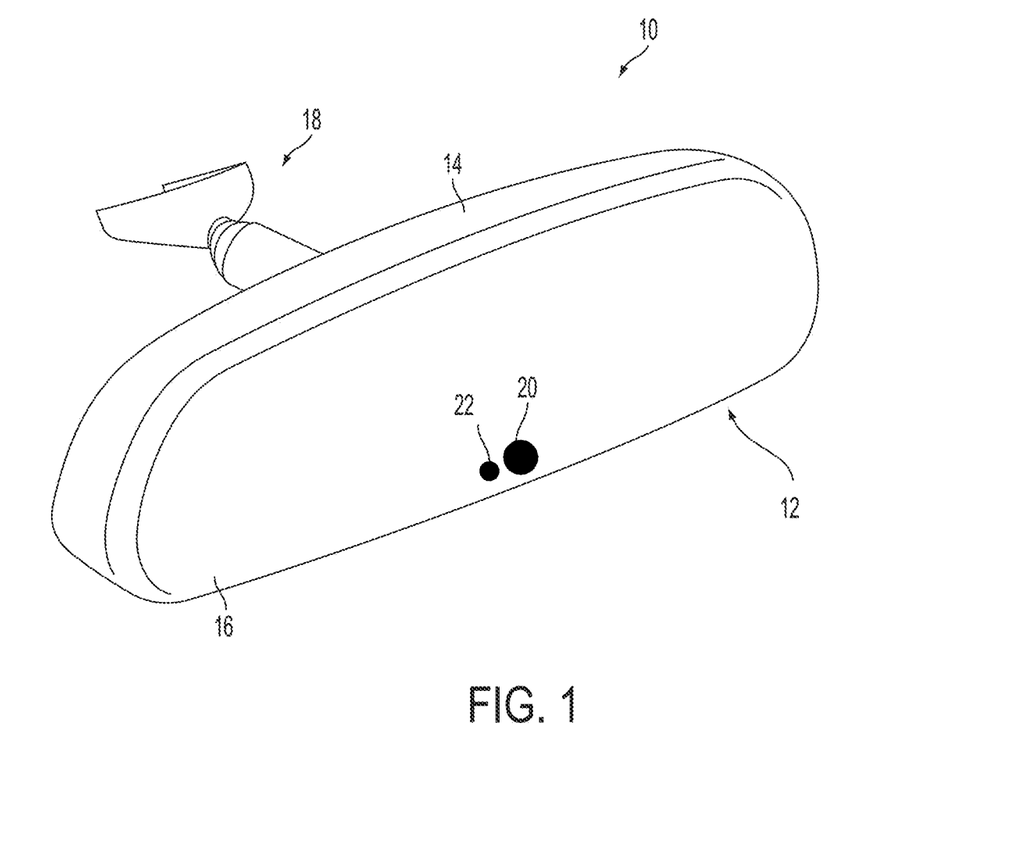
FIG. 1 is a perspective view of an interior rearview mirror assembly.

Referring now to the drawings and the illustrative embodiments depicted therein, an interior rearview mirror assembly 10 for a vehicle includes a mirror head 12 including a casing 14 and a reflective element 16 positioned at a front portion of the casing 14 (FIG. 1). In the illustrated example, the mirror assembly 10 is configured to be adjustably mounted to an interior portion of an interior cabin of a vehicle (such as to an interior or in-cabin surface of a vehicle windshield or a headliner of a vehicle or the like) via a mounting structure or mounting configuration or assembly 18. The mirror reflective element may include a variable reflectance mirror reflective element that varies its reflectance responsive to electrical current applied to conductive coatings or layers of the reflective element.

The interior rearview mirror assembly 10 accommodates one or more heat generating electronic components within the mirror head 12. For example, a printed circuit board (PCB) having one or more heat generating electronic components (e.g., image or data processors, light emitters, cameras and the like) and/or a video display screen may be accommodated within an interior cavity of the mirror casing 14 behind the mirror reflective element 16. When the electronic components (including the display screen) are electrically operated, heat is generated at the interior of the mirror head 12 and can, if operated without sufficient cooling, exceed the functional thermal load of the components. Thus, the mirror assembly 10 is configured to provide at least passive cooling for the heat generating electronic components accommodated by the mirror head. For example, one or more heatsinks may be thermally coupled to the heat generating electronic components to draw heat away from the components to be dissipated from the heatsink and exterior of the mirror head 12. For example, the heat drawn by the heatsink may be dissipated to the ambient air of the cabin through thermal transfer to the exterior surface of the mirror casing 14 and/or via one or more vents or slots formed through the mirror casing that allow cooling airflow to flow along the heatsink and draw heat away from the heatsink. As discussed further below, the heatsink may include a two-phase heatsink formed via additive manufacturing with an increased thermal capacity compared to standard or traditional heatsinks.

The mirror assembly 10 may include or may be associated with a driver monitoring system (DMS) and/or an occupant monitoring system (OMS), with the mirror assembly including a driver/occupant monitoring camera 20 disposed at a back plate (and viewing through an aperture of the back plate) behind the reflective element 16 and viewing through the reflective element 16 toward at least a head region of the driver of the vehicle. Further, the DMS includes an infrared light (IR light) or near infrared light (near IR light) emitter 22 disposed at the back plate and emitting IR light or near IR light that passes through another aperture of the back plate and, optionally, through the mirror reflective element 16. Further, the monitoring system includes an electronic control unit (ECU) having electronic circuitry and associated software, including an image processor for processing image data captured by the DMS/OMS camera. Image data captured by the camera may be processed for a head and face direction and position tracking system and/or eye tracking system and/or gesture recognition system. The DMS camera and monitoring system and/or head and face direction and/or position tracking systems and/or eye tracking systems and/or gesture recognition systems may utilize aspects of the systems described in U.S. Pat. Nos. 11,582,425; 11,518,401; 10,958,830; 10,065,574; 10,017,114; 9,405,120 and/or 7,914,187, and/or U.S. Publication Nos. US-2022-0377219; US-2022-0254132; US-2022-0242438; US-2021-0323473; US-2021-0291739; US-2020-0320320; US-2020-0202151; US-2020-0143560; US-2019-0210615; US-2018-0231976; US-2018-0222414; US-2017-0274906; US-2017-0217367; US-2016-0209647; US-2016-0137126; US-2015-0352953; US-2015-0296135; US-2015-0294169; US-2015-0232030; US-2015-0092042; US-2015-0022664; US-2015-0015710; US-2015-0009010 and/or US-2014-0336876, and/or U.S. patent application Ser. No. 18/508,351, filed Nov. 14, 2023, Ser. No. 18/535,183, filed Dec. 11, 2023 and/or Ser. No. 18/666,959, filed May 17, 2024, and/or U.S. provisional application Ser. No. 63/641,574, filed May 2, 2024, and/or International Publication Nos. WO 2023/220222; WO 2023/034956; WO 2022/241423 and/or WO 2022/187805, which are all hereby incorporated herein by reference in their entireties.

Optionally, the driver monitoring system may be integrated with a camera monitoring system (CMS) of the vehicle. The integrated vehicle system incorporates multiple inputs, such as from the inward viewing or driver monitoring camera and from a forward or outward viewing camera, as well as from a rearward viewing camera and sideward viewing cameras of the CMS, to provide the driver with unique collision mitigation capabilities based on full vehicle environment and driver awareness state. The image processing and detections and determinations are performed locally within the interior rearview mirror assembly and/or the overhead console region, depending on available space and electrical connections for the particular vehicle application. The CMS cameras and system may utilize aspects of the systems described in U.S. Pat. No. 11,242,008 and/or U.S. Publication Nos. US-2021-0162926; US-2021-0155167; US-2018-0134217 and/or US-2014-0285666, and/or International Publication No. WO 2022/150826, which are all hereby incorporated herein by reference in their entireties.

Electronic components associated with the DMS and/or the CMS may generate heat at the interior of the mirror head 12 when electrically operated. For example, the near IR light emitter 22, when electrically operated to emit light that passes through the mirror reflective element 16, generates heat. Further, the ECU disposed within the mirror head includes one or more data processors or image processors for processing image data and/or sensor data for the DMS, OMS, and/or CMS functions. When the one or more processors are operated to process the sensor data, heat is generated within the mirror head 12.

The ECU may receive image data captured by a plurality of cameras of the vehicle, such as by a plurality of surround view system (SVS) cameras and a plurality of camera monitoring system (CMS) cameras and optionally one or more driver monitoring system (DMS) cameras. The ECU may comprise a central or single ECU that processes image data captured by the cameras for a plurality of driving assist functions and may provide display of different video images to a video display screen in the vehicle (such as at an interior rearview mirror assembly or at a central console or the like) for viewing by a driver of the vehicle. The system may utilize aspects of the systems described in U.S. Pat. Nos. 11,242,008; 10,442,360 and/or 10,046,706, and/or U.S. Publication Nos. US-2021-0155167 and/or US-2019-0118717, and/or International Publication No. WO 2022/150826, which are all hereby incorporated herein by reference in their entireties.

The mirror assembly may comprise an auto-dimming mirror reflective element (e.g., an electrochromic mirror reflective element) or a prismatic mirror reflective element. Both types of mirrors may be provided with a video display screen that is disposed behind and is viewable through the mirror reflective element. Such video mirrors include a backlit LCD display screen, and a particular form of video mirror is a full display mirror (such a ClearView™ Interior Rearview Mirror Assembly available from Magna Mirrors of America, Inc. of Holland, MI USA, or an FDM™ Interior Rearview Mirror Assembly available from Gentex Corporation of Zeeland, MI USA), where the video display screen fills the reflective region, such as by utilizing aspects of the mirror assemblies and systems described in U.S. Pat. Nos. 11,242,008; 11,214,199; 10,442,360; 10,421,404; 10,166,924; 10,046,706 and/or 10,029,614, and/or U.S. Publication Nos. US-2021-0162926; US-2019-0258131; US-2019-0146297; US-2019-0118717 and/or US-2017-0355312, which are all hereby incorporated herein by reference in their entireties. When electrically operated to display images that are viewable through the mirror reflective element 16, the video display screen generates heat within the mirror head 12.

Referring to FIGS. 2-8, one or more of the heat generating electronic components are thermally coupled to a hybrid heatsink assembly 26 within the mirror head 12 for dissipating heat generated by the electronic component exterior the mirror head 12. For example, a heat source 24, such as a PCB accommodating the one or more heat generating electronic components (e.g., the DMS camera, the image and/or data processor and the like) or the video display screen, is thermally coupled to the heatsink assembly 26. The PCB or video display screen may be directly attached to the heatsink assembly 26, such as via a thermal paste, snap attachment, threaded fasteners, and the like.

Figure 2:
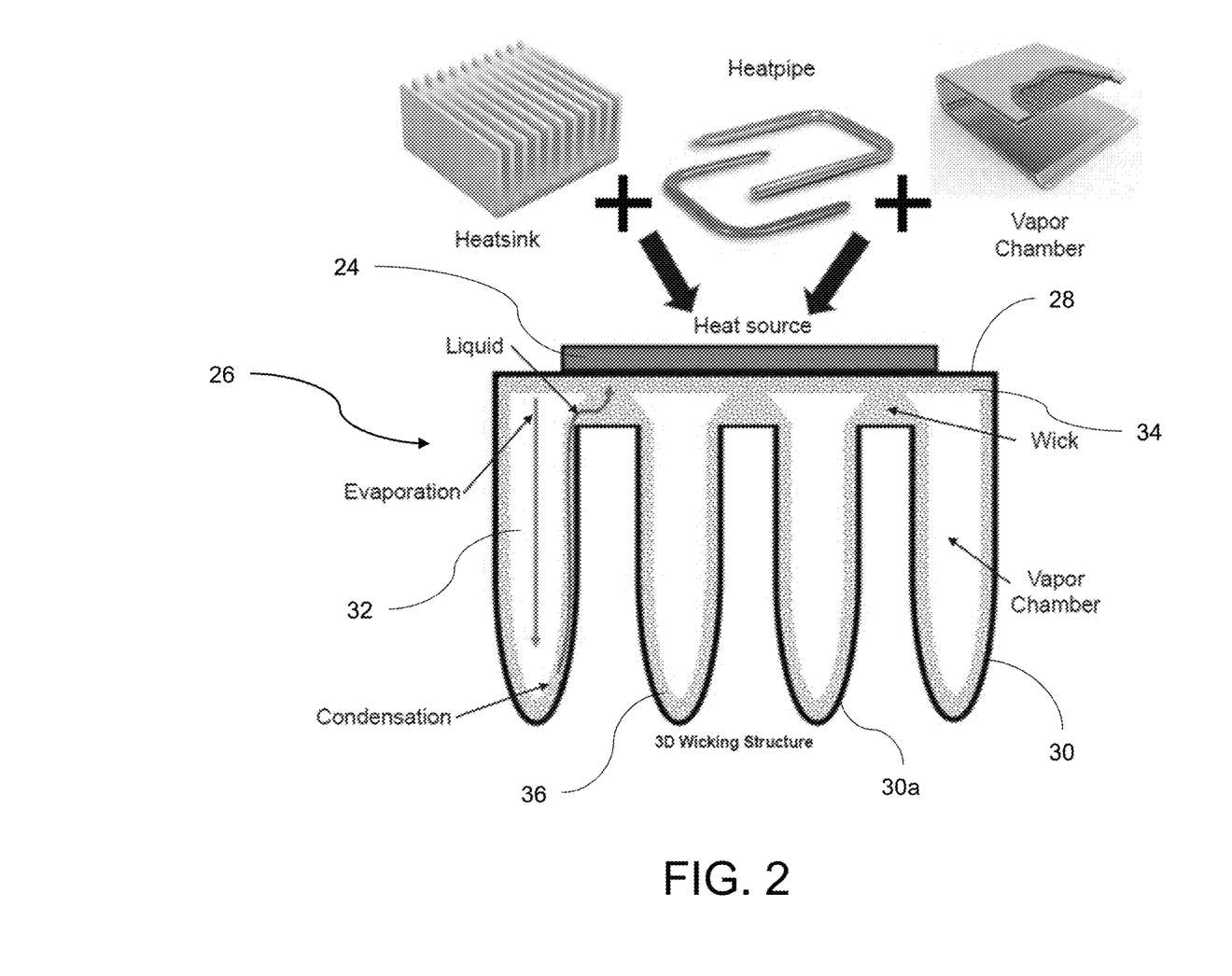
FIG. 2 is a sectional view of a heatsink assembly thermally coupled to a heat generating electronic component within the mirror head of the interior rearview mirror assembly.

The heatsink assembly 26 may include a first half or portion, such as a backing plate portion 28, and a second half or portion, such as a heat dissipating portion 30, that join together to define an interior pocket or recess or vapor chamber 32. The heat source 24 is thermally coupled to the backing plate portion 28 of the heatsink assembly 26 and the backing plate portion 28 may attach the mirror reflective element 16 to the mirror casing 14, such that the heat source 24 is disposed between the mirror reflective element 16 and the backing plate portion 28.

The backing plate portion 28 is coupled to or integrally formed with the hollowed heat dissipating portion 30, such that the vapor chamber 32 is between the backing plate portion 28 and the heat dissipating portion 30. The vapor chamber 32 may be defined by or extend between respective inner surfaces of the backing plate portion 28 and the heat dissipating portion 30. The heat dissipating portion 30 extends from the backing plate portion 28 and toward the inner surface of the mirror casing 14. For example, the heat dissipating portion 30 may include one or more heat dissipating fins 30a extending away from the backing plate portion 28. The heat dissipating portion 30 may be in thermally conductive connection with the mirror casing 14 to dissipate heat to the mirror casing 14 and exterior the mirror head 12. For example, a thermally conductive paste or interface may be disposed between the heat dissipating portion 30 and the inner surface of the mirror casing 14.

Figure 3:
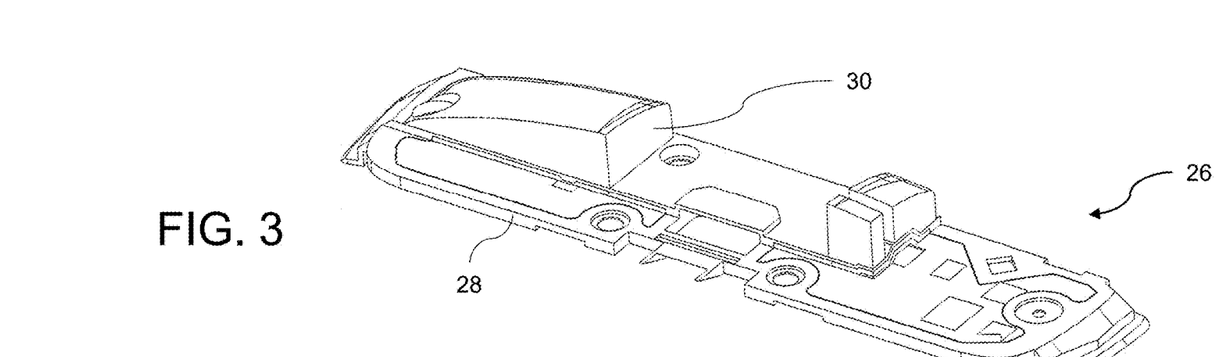
FIG. 3 is a perspective view of the heatsink assembly.
Figure 4:
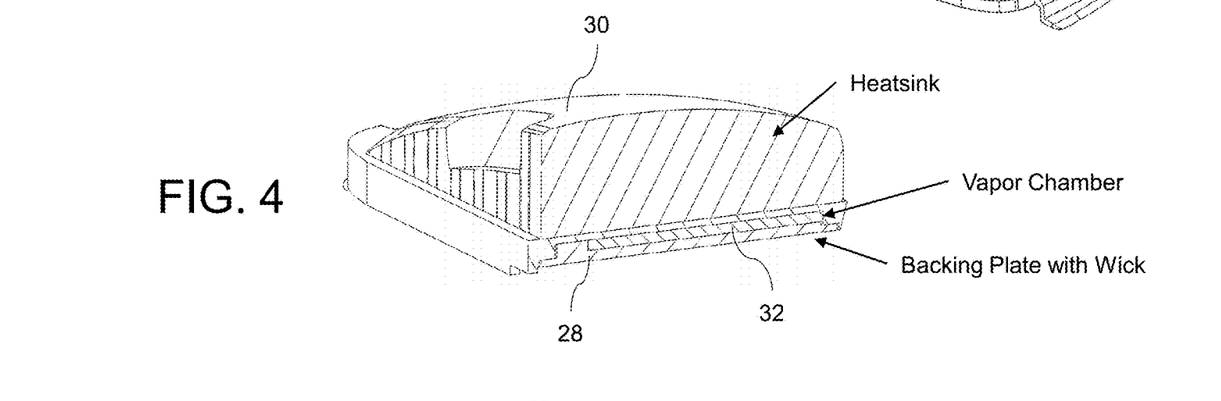
FIGS. 4 and 5 are sectional views of the heatsink assembly.
Figure 5:
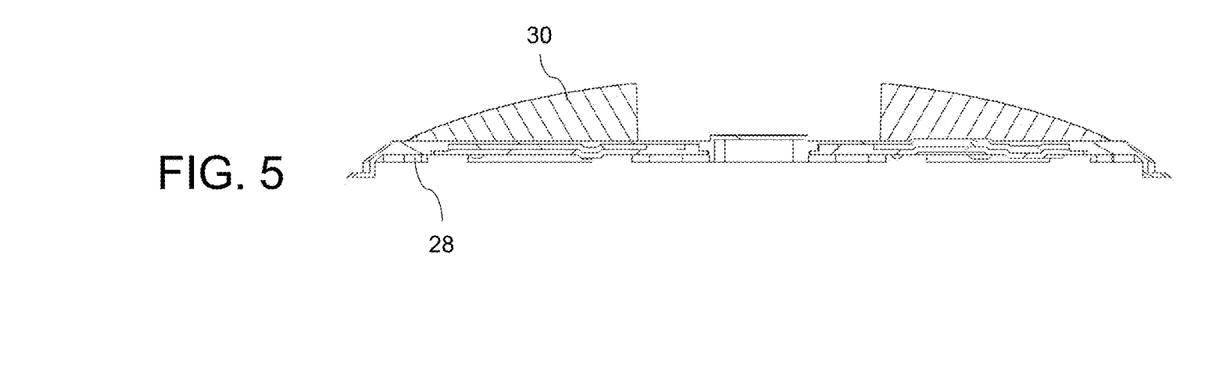
Figure 6:
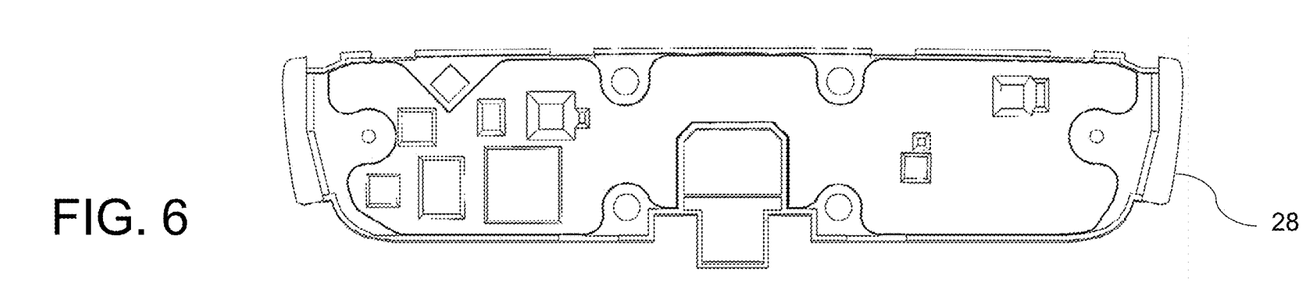
FIGS. 6-8 are plan views of the backing plate portion of the heatsink assembly during different phases of an additive manufacturing process.
Figure 7:
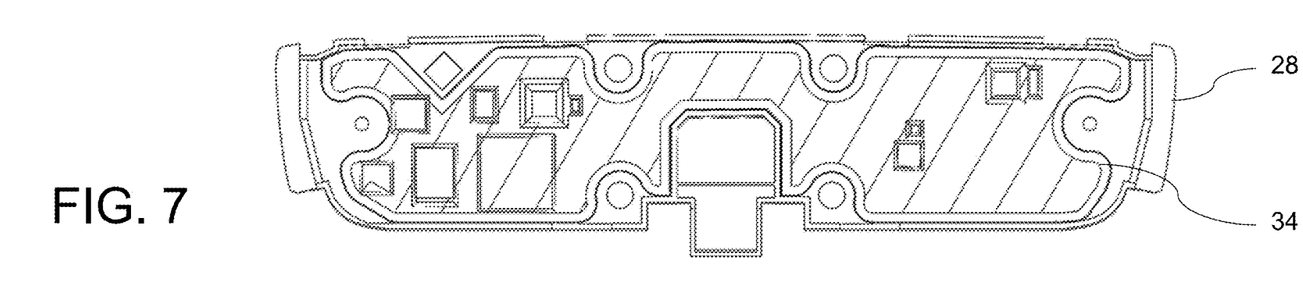
Figure 8:
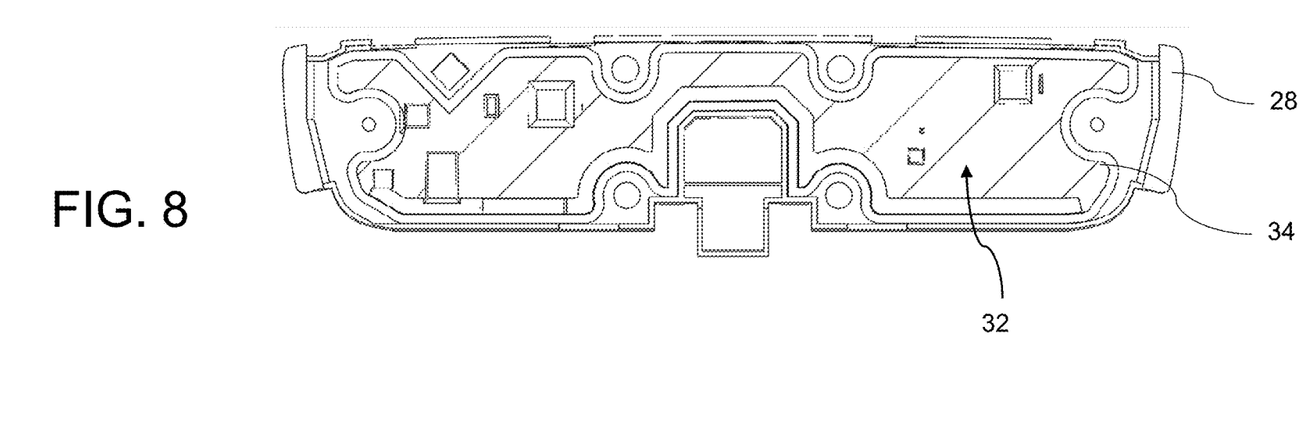

Optionally, the heat dissipating portion 30 may substantially conform to the shape of the mirror casing and/or other components within the mirror head 12. That is, and as shown in FIGS. 3-5, a profile or shape of the heat dissipating portion 30 may generally correspond to a contour or shape of the inner surface of the mirror casing 14. In the illustrated example, the heat dissipating portion 30 has an arcuate or curved profile to substantially match the curved contour of the inner surface of the mirror casing 14. This allows the heat dissipating portion 30 to be in contact or close proximity to the inner surface of the mirror casing 14 and more uniformly dissipate heat across the mirror casing 14. Indentations or cutouts may be formed along the heat dissipating portion 30 to accommodate other components within or structure of the mirror head, such as a socket receiving a ball member of the mounting structure, electrical connectors, and the like.

A phase-changing liquid or refrigerant is disposed within the chamber 32 to assist in the thermal transfer from the backing plate portion 28 along the heat dissipating portion 30 and away from the heatsink assembly 26. With the backing plate portion 28 and the heat dissipating portion 30 joined together, the phase-changing refrigerant may be sealed within the chamber 32. The backing plate portion 28 may include a porous internal lattice or wick structure 34 and the heat dissipating portion 30 may include a porous internal lattice or wick structure 36 (FIG. 2) such that the phase-changing liquid may be free to flow along the interior surfaces of the backing plate portion 28 and the heat dissipating portion 30 and at least partially through and within the backing plate wick or lattice structure 34 and/or the heatsink wick or lattice structure 36. In other words, the internal lattice structure 34 of the backing plate portion 28 and the internal lattice structure 36 of the heat dissipating portion 30 extend along the inner surface of the heat sink assembly 26 so that the phase-changing refrigerant may flow along and at least partially within the inner surfaces of the heat sink assembly 26. This may increase the surface area of the heatsink assembly 26 in contact with the phase-changing refrigerant to improve or enhance thermal transfer between the heatsink assembly 26 and the refrigerant. The backing plate wick 34 may also act to retain refrigerant across the backing plate portion 28 and at or near the heat source 24 despite changes in orientation of the mirror head (e.g., due to the driver adjusting the mirror head to adjust the rearward view provided by the mirror assembly).

As shown in FIG. 2, heat generated by the heat source 24 is dissipated to the backing plate portion 28 and the phase-changing refrigerant boils to transfer or convey the heat along the heat dissipating portion 30. That is, refrigerant in liquid form within the vapor chamber 32 at or near or adjacent the backing plate portion 28, such as at least partially within the lattice structure or wick 34 of the backing plate portion 28, boils or vaporizes in response to the heat generated by the heat source 24. The phase-changing refrigerant may be selected or configured to have a boiling point suitable to maintain an acceptable operating temperature at the heat source 24. That is, the phase-changing refrigerant may be configured to boil (and thus transfer or convey heat away from the heat source 24) at a temperature that is below a maximum operating temperature of the heat source 24 to preclude the heat source 24 from reaching its maximum operating temperature. For example, the phase-changing refrigerant may boil when heated to a temperature of 80 degrees Fahrenheit or more, 100 degrees Fahrenheit or more, 120 degrees Fahrenheit or more, 200 degrees Fahrenheit or more and the like. The gaseous refrigerant may then return to liquid form when cooled to a temperature below the boiling point.

Thus, after the liquid refrigerant boils or vaporizes, gaseous refrigerant then moves or flows along the vapor chamber 32 and the hollowed heat dissipating portion 30, such as within and along respective heat dissipating fins 30a, where the heated and gaseous refrigerant condenses at or against the cooler surface of the heat dissipating portion 30 to transfer or convey heat to the heat dissipating portion 30. The lattice structure 36 may increase the surface area of the heat dissipating portion 30 in contact with the gaseous refrigerant to improve or enhance thermal transfer between the gaseous refrigerant and the heat dissipating portion 30. The transferred or conveyed heat may then be dissipated exterior the mirror head 12 from the heat dissipating portion 30. The condensed refrigerant may then flow along the heat dissipating portion 30, such as at least partially within the lattice structure 36 of the heat dissipating portion 30, back toward the backing plate portion 28. Thus, the heatsink assembly 26 may provide the functionality of a heatsink, a heat pipe and a vapor chamber to dissipate heat away from the heat source 24 and exterior the mirror head 12.

The backing plate portion 28 of the heatsink assembly 26 may be formed via additive manufacturing or 3D printing. Thus, the backing plate portion 28 may include a receiving surface or layer (e.g., FIG. 6) for interfacing with the one or more heat sources within the mirror head 12. For example, the receiving layer may receive the mirror reflective element 16 and attach to the mirror casing 14 to secure the mirror reflective element 16 at the mirror casing 14 with the one or more heat generating electronic components between the mirror reflective element 16 and the backing plate portion 28. The porous internal lattice structure or wick 34 (e.g., FIG. 7) is added to (e.g., via additive manufacturing) or extends from the receiving layer so that the phase-changing liquid may flow within and along the wick 34 of the backing plate portion 28 for absorbing heat dissipated to the backing plate portion 28. A portion or layer may extend from the wick 34 (e.g., FIG. 8) to engage the heat dissipating portion 30 for joining the two portions of the heatsink assembly 26 together to define the vapor chamber 32. The heat dissipating portion 30 may be formed via additive manufacturing, or the heat dissipating portion 30 may comprise a die cast or stamped heat dissipating portion 30 that may or may not include the heat dissipating fins 30a. In some examples, the refrigerant may be injected or added into the chamber 32 during the additive manufacturing process, such as via a port formed through the backing plate portion 28 or heat dissipating portion 30 that is closed over or filled in following addition of the refrigerant. Optionally, the refrigerant may be added to one or both of the backing plate portion 28 and the heat dissipating portion 30 prior to joining the two portions together, such as via a coating process (where the refrigerant is applied to surfaces of the portion) or a filling process and the like.

Additive manufacturing of the heatsink assembly 26 allows for conformal designs, where the heatsink assembly 26 may substantially conform to or accommodate internal structure and other components within the mirror head 12 and the interior surface of the mirror casing 14. Thus, the heatsink assembly 26 may be uniquely shaped to provide passive cooling to heat generating components at any suitable position within the mirror head 12. Further, the additive manufacturing may provide for reduced packaging and lower mass compared to standard heatsinks. The heatsink assembly 26 may comprise any thermally conductive material suitable for use with additive manufacturing processes, such as a thermoplastic material (e.g., polyactic acid) or metallic material (e.g., titanium or stainless steel). The internal lattice structure or wick of the backing plate portion 28 and/or heat dissipating portion 30 may increase the capillary force for liquid transport within the vapor chamber 32, resulting in higher heat removal and increasing the thermal capacity of the heatsink assembly 26. The additive manufacturing process and internal lattice structure may include characteristics of the heatsinks described in International Publication No. WO 2021/163312, which is hereby incorporated herein by reference in its entirety.

Thus, the hybrid heatsink assembly 26 includes two halves or portions that form the vapor chamber 32. The first half or portion or backing plate portion 28 includes a 3D printed backing plate with integrated lattice wicking structure. The second half or portion or heat dissipating portion 30 includes a die cast or stamped metal or plastic that may embody the traditional appearance of a heatsink (e.g., it may or may not contain fins). The two halves or portions form the vapor chamber 32 containing the phase-changing liquid/vapor.

Heat transferred or conveyed to the heat dissipating portion 30 of the heatsink assembly 26 via the phase-changing refrigerant is dissipated from the heatsink assembly 26 and exterior the mirror head 12. For example, the heatsink assembly 26 may be thermally coupled to the mirror casing 14 for transferring heat to the mirror casing 14 to be dissipated to the ambient air of the vehicle cabin. Optionally, one or more slits or vents may be formed in the mirror casing so that cooling airflow may pass along and across the heat dissipating portion 30 to draw heat from the mirror head 12. Further, one or more electrically operable cooling fans may be disposed within the mirror head 12. When the cooling fan is electrically operated, the cooling fan directs airflow within the mirror head and along and across the heatsink assembly 26 to provide active cooling of the interior of the mirror head 12. For example, the interior rearview mirror assembly and mirror casing may include characteristics of the mirror assemblies described in U.S. patent application Ser. No. 18/390,166, filed Dec. 20, 2023, which is hereby incorporated herein by reference in its entirety.

The video display screen of the video mirror, when the mirror is in the display mode, may display video images derived from video image data captured by a rearward viewing camera, such as a rearward camera disposed at a center high-mounted stop lamp (CHMSL) location, and/or video image data captured by one or more other cameras at the vehicle, such as side-mounted rearward viewing cameras or the like, such as by utilizing aspects of the display systems described in U.S. Pat. No. 11,242,008, which is hereby incorporated herein by reference in its entirety.

Changes and modifications in the specifically described embodiments may be carried out without departing from the principles of the present invention, which is intended to be limited only by the scope of the appended claims as interpreted according to the principles of patent law.

The invention claimed is:

1. A vehicular interior rearview mirror assembly, the vehicular interior rearview mirror assembly comprising:
   a mirror head adjustable about a mounting structure, wherein the mounting structure is configured to mount the vehicular interior rearview mirror assembly at an interior portion of an interior cabin of a vehicle;
   wherein the mirror head comprises a mirror casing and a mirror reflective element;
   an electronic component accommodated within an interior cavity of the mirror head;
   a heatsink assembly accommodated by the mirror head;
   wherein the heatsink assembly comprises (i) a first portion that is thermally coupled to the electronic component, (ii) a second portion that extends away from the first portion and away from the electronic component, (iii) a chamber extending between an inner surface of the first portion and an inner surface of the second portion and (iv) a phase-changing refrigerant within the chamber;
   wherein, when the electronic component is electrically operated and generates heat within the interior cavity of the mirror head, the first portion of the heatsink assembly draws heat away from the electronic component;
   wherein, with the phase-changing refrigerant in a liquid phase and responsive to heating of the first portion of the heatsink assembly, the phase-changing refrigerant draws heat from the first portion of the heatsink assembly by changing from the liquid phase to a gaseous phase;
   wherein, with the phase-changing refrigerant in the gaseous phase, the phase-changing refrigerant flows within the chamber and along the second portion of the heatsink assembly and condenses at the inner surface of the second portion of the heatsink assembly to transfer heat to the second portion of the heatsink assembly; and
   wherein heat is dissipated from the second portion of the heatsink assembly to exterior the mirror head.

2. The vehicular interior rearview mirror assembly of claim 1, wherein the first portion of the heatsink assembly comprises a backing plate, and wherein the backing plate attaches to the mirror reflective element and the mirror casing to secure the mirror reflective element at the mirror casing.

3. The vehicular interior rearview mirror assembly of claim 2, wherein the electronic component is disposed between the backing plate and the mirror reflective element.

4. The vehicular interior rearview mirror assembly of claim 1, wherein the second portion of the heatsink assembly comprises one or more heat dissipating fins.

5. The vehicular interior rearview mirror assembly of claim 1, wherein at least one selected from the group consisting of (i) the first portion of the heatsink assembly comprises a porous lattice structure and (ii) the second portion of the heatsink assembly comprises the porous lattice structure, and wherein the phase-changing refrigerant flows between the chamber and the porous lattice structure.

6. The vehicular interior rearview mirror assembly of claim 1, wherein at least one selected from the group consisting of (i) the first portion of the heatsink assembly is formed via an additive manufacturing process and (ii) the second portion of the heatsink assembly is formed via the additive manufacturing process.

7. The vehicular interior rearview mirror assembly of claim 6, wherein the first portion of the heatsink assembly is formed via the additive manufacturing process, and wherein the second portion of the heatsink assembly is formed via one selected from the group consisting of (i) a die cast process and (ii) a stamping process.

8. The vehicular interior rearview mirror assembly of claim 1, wherein the second portion of the heatsink assembly extends from the first portion of the heatsink assembly and toward an interior surface of the mirror casing, and wherein the second portion of the heatsink assembly comprises a profile corresponding to a contour of the interior surface of the mirror casing.

9. The vehicular interior rearview mirror assembly of claim 1, wherein the mirror casing comprises one or more vents formed through the mirror casing, and wherein cooling airflow passes through the one or more vents and along the second portion of the heatsink assembly to dissipate heat from the second portion of the heatsink assembly to exterior the mirror head.

10. The vehicular interior rearview mirror assembly of claim 1, wherein the second portion of the heatsink assembly is thermally coupled to the mirror casing, and wherein heat is dissipated from the second portion of the heatsink assembly to exterior the mirror head via thermal transfer between the second portion of the heatsink assembly and the mirror casing.

11. The vehicular interior rearview mirror assembly of claim 1, wherein the mirror head accommodates a driver monitoring camera that captures image data for a driver monitoring function.

12. The vehicular interior rearview mirror assembly of claim 11, wherein the electronic component comprises the driver monitoring camera.

13. The vehicular interior rearview mirror assembly of claim 11, wherein the mirror head accommodates a printed circuit board (PCB) comprising an image processor for processing image data captured by the driver monitoring camera, and wherein the electronic component comprises the image processor.

14. The vehicular interior rearview mirror assembly of claim 1, wherein the electronic component comprises a video display screen, and wherein the video display screen, when electrically operated, displays video images that are viewable by a driver of the vehicle.

15. A vehicular interior rearview mirror assembly, the vehicular interior rearview mirror assembly comprising:
   a mirror head adjustable about a mounting structure, wherein the mounting structure is configured to mount the vehicular interior rearview mirror assembly at an interior portion of an interior cabin of a vehicle;
   wherein the mirror head comprises a mirror casing and a mirror reflective element;
   an electronic component accommodated within an interior cavity of the mirror head;
   a heatsink assembly accommodated by the mirror head;
   wherein the heatsink assembly comprises (i) a first portion that is thermally coupled to the electronic component, (ii) a second portion that extends away from the first portion and away from the electronic component, (iii) a chamber extending between an inner surface of the first portion and an inner surface of the second portion and (iv) a phase-changing refrigerant within the chamber;
   wherein the first portion of the heatsink assembly comprises a backing plate, and wherein the backing plate attaches to the mirror reflective element and the mirror casing to secure the mirror reflective element at the mirror casing;
   wherein the second portion of the heatsink assembly is thermally coupled to the mirror casing;
   wherein, when the electronic component is electrically operated and generates heat within the interior cavity of the mirror head, the first portion of the heatsink assembly draws heat away from the electronic component;
   wherein, with the phase-changing refrigerant in a liquid phase and responsive to heating of the first portion of the heatsink assembly, the phase-changing refrigerant draws heat from the first portion of the heatsink assembly by changing from the liquid phase to a gaseous phase;
   wherein, with the phase-changing refrigerant in the gaseous phase, the phase-changing refrigerant flows within the chamber and along the second portion of the heatsink assembly and condenses at the inner surface of the second portion of the heatsink assembly to transfer heat to the second portion of the heatsink assembly; and
   wherein heat is dissipated from the second portion of the heatsink assembly to exterior the mirror head via thermal transfer between the second portion of the heatsink assembly and the mirror casing.

16. The vehicular interior rearview mirror assembly of claim 15, wherein the electronic component is disposed between the backing plate and the mirror reflective element.

17. The vehicular interior rearview mirror assembly of claim 15, wherein the second portion of the heatsink assembly comprises one or more heat dissipating fins.

18. The vehicular interior rearview mirror assembly of claim 15, wherein the mirror casing comprises one or more vents formed through the mirror casing, and wherein cooling airflow passes through the one or more vents and along the second portion of the heatsink assembly to dissipate heat from the second portion of the heatsink assembly to exterior the mirror head.

19. The vehicular interior rearview mirror assembly of claim 15, wherein the electronic component comprises a video display screen, and wherein the video display screen, when electrically operated, displays video images that are viewable by a driver of the vehicle.

20. A vehicular interior rearview mirror assembly, the vehicular interior rearview mirror assembly comprising:
   a mirror head adjustable about a mounting structure, wherein the mounting structure is configured to mount the vehicular interior rearview mirror assembly at an interior portion of an interior cabin of a vehicle;
   wherein the mirror head comprises a mirror casing and a mirror reflective element;
   wherein the mirror head accommodates a driver monitoring camera that captures image data for a driver monitoring function;
   wherein the mirror head accommodates a printed circuit board (PCB) comprising an image processor for processing image data captured by the driver monitoring camera;
   a heatsink assembly accommodated by the mirror head;
   wherein the heatsink assembly comprises (i) a first portion that is thermally coupled to the image processor, (ii) a second portion that extends away from the first portion and away from the image processor, (iii) a chamber extending between an inner surface of the first portion and an inner surface of the second portion and (iv) a phase-changing refrigerant within the chamber;

wherein the second portion of the heatsink assembly comprises one or more heat dissipating fins;

wherein, when the image processor is electrically operated and generates heat within the mirror head, the first portion of the heatsink assembly draws heat away from the image processor;

wherein, with the phase-changing refrigerant in a liquid phase and responsive to heating of the first portion of the heatsink assembly, the phase-changing refrigerant draws heat from the first portion of the heatsink assembly by changing from the liquid phase to a gaseous phase;

wherein, with the phase-changing refrigerant in the gaseous phase, the phase-changing refrigerant flows within the chamber and along the second portion of the heatsink assembly and condenses at the inner surface of the second portion of the heatsink assembly to transfer heat to the second portion of the heatsink assembly; and wherein heat is dissipated from the second portion of the heatsink assembly to exterior the mirror head.

21. The vehicular interior rearview mirror assembly of claim 20, wherein at least one selected from the group consisting of (i) the first portion of the heatsink assembly comprises a porous lattice structure and (ii) the second portion of the heatsink assembly comprises the porous lattice structure, and wherein the phase-changing refrigerant flows between the chamber and the porous lattice structure.

22. The vehicular interior rearview mirror assembly of claim 20, wherein the mirror casing comprises one or more vents formed through the mirror casing, and wherein cooling airflow passes through the one or more vents and along the second portion of the heatsink assembly to dissipate heat from the second portion of the heatsink assembly to exterior the mirror head.

23. The vehicular interior rearview mirror assembly of claim 20, wherein the second portion of the heatsink assembly is thermally coupled to the mirror casing, and wherein heat is dissipated from the second portion of the heatsink assembly to exterior the mirror head via thermal transfer between the second portion of the heatsink assembly and the mirror casing.

* * * * *